United States Patent
Hsu et al.

(10) Patent No.: US 8,232,152 B2
(45) Date of Patent: Jul. 31, 2012

(54) REMOVING METHOD OF A HARD MASK

(75) Inventors: Che-Hua Hsu, Hsinchu County (TW);
Shao-Hua Hsu, Taoyuan County (TW);
Zhi-Cheng Lee, Tainan (TW);
Cheng-Guo Chen, Changhua County (TW); Shin-Chi Chen, Tainan County (TW); Hung-Ling Shih, Chiayi County (TW); Hung-Yi Wu, Keelung (TW);
Heng-Ching Huang, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/883,233

(22) Filed: Sep. 16, 2010

(65) Prior Publication Data
US 2012/0070952 A1    Mar. 22, 2012

(51) Int. Cl.
*H01L 21/336*    (2006.01)

(52) U.S. Cl. ........ 438/197; 438/196; 257/E21.177; 257/E21.231

(58) Field of Classification Search ........ 438/197, 438/196, 142, 151; 257/E21.177, E21.231
See application file for complete search history.

(56) References Cited

U.S. PATENT DOCUMENTS

| | | | |
|---|---|---|---|
| 2008/0085590 A1* | 4/2008 | Yao et al. | 438/583 |
| 2008/0093682 A1* | 4/2008 | Yao et al. | 257/413 |
| 2010/0019344 A1* | 1/2010 | Chuang et al. | 257/516 |
| 2010/0052058 A1* | 3/2010 | Hsu et al. | 257/364 |

FOREIGN PATENT DOCUMENTS

TW    423061    2/2001

OTHER PUBLICATIONS

Chen and Wang, "Hexamethyldisiloxane film as the bottom antireflective coating layer for ArF excimer laser lithography," Applied Optics, 22, 4885-4890, 1999.*

* cited by examiner

*Primary Examiner* — Julia Slutsker
(74) *Attorney, Agent, or Firm* — WPAT, PC; Justin King

(57) ABSTRACT

A removing method of a hard mask includes the following steps. A substrate is provided. At least two MOSFETs are formed on the substrate. An isolating structure is formed in the substrate and located between the at least two MOSFETs. Each of the MOSEFTs includes a gate insulating layer, a gate, a spacer and a hard mask on the gate. A protecting structure is formed on the isolating structure and the hard mask is exposed from the protecting structure. The exposed hard mask is removed to expose the gate.

8 Claims, 5 Drawing Sheets

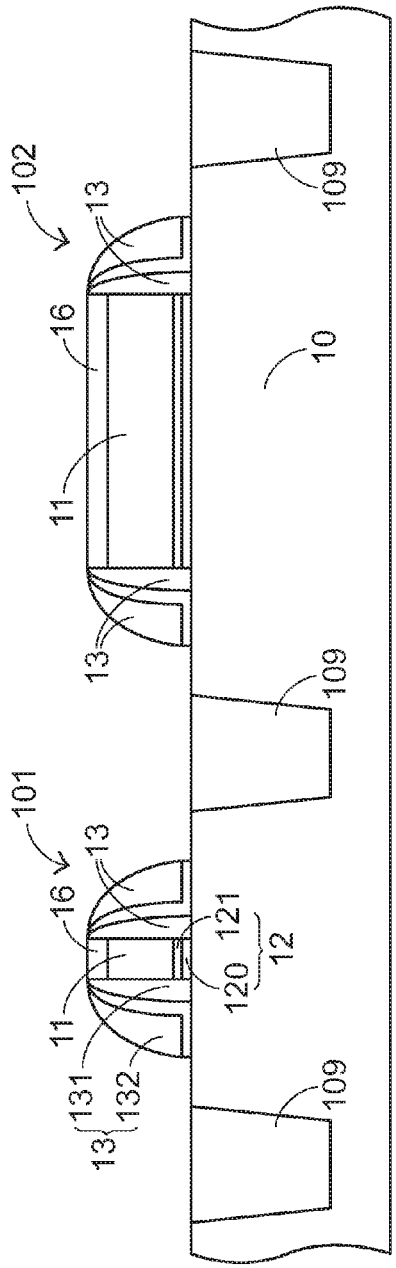
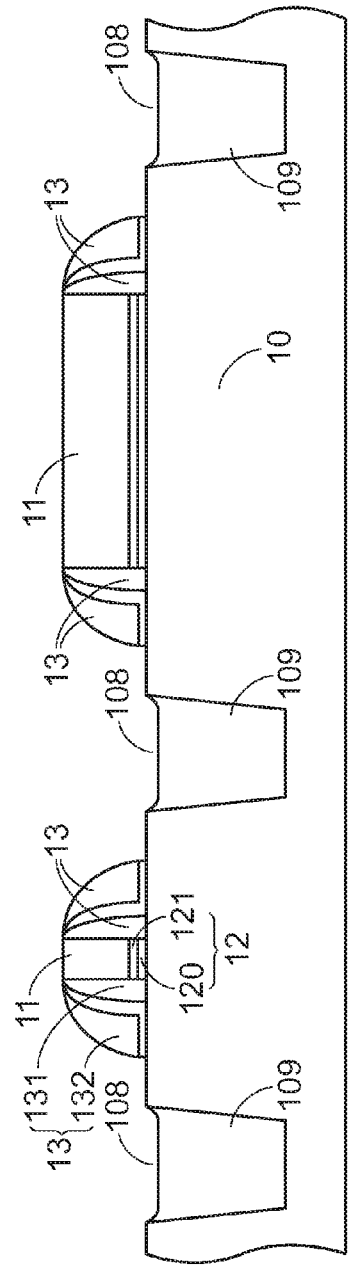
FIG. 1A
PRIOR ART
FIG. 1B
PRIOR ART

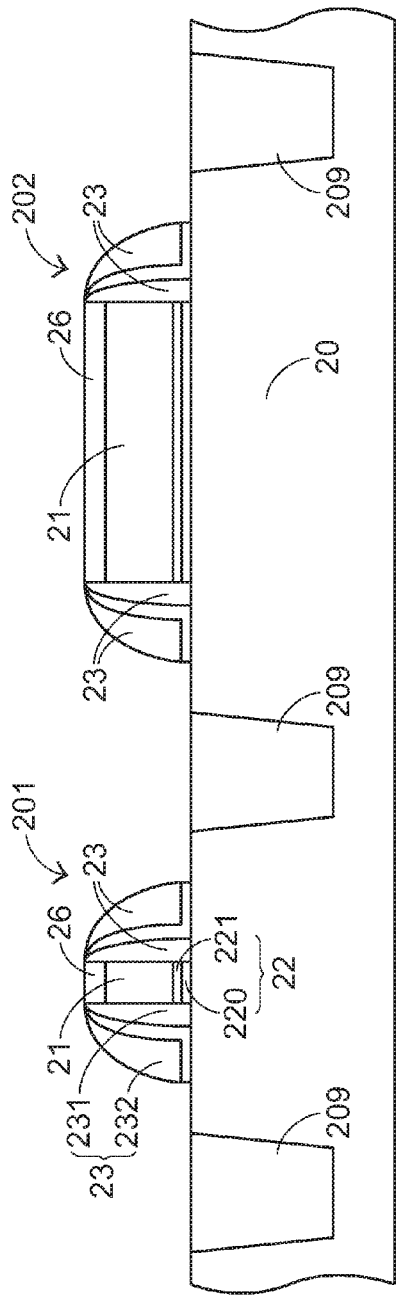
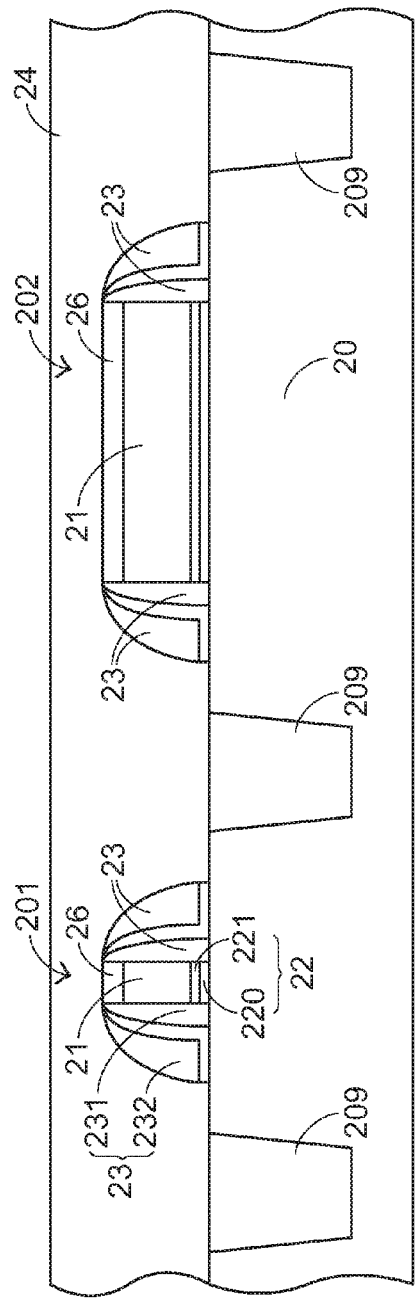
FIG.2A
FIG.2B

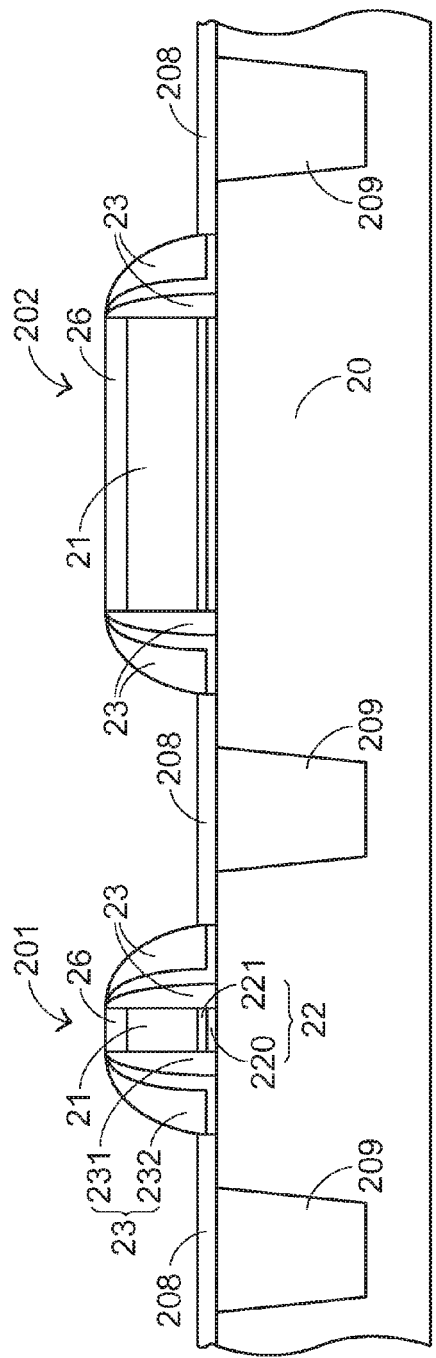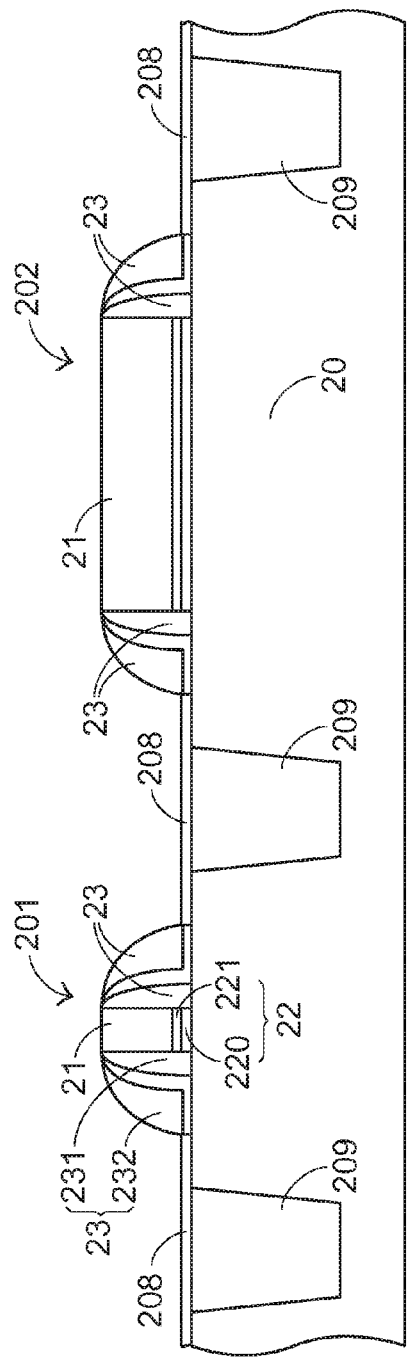

REMOVING METHOD OF A HARD MASK

BACKGROUND

1. Field of the Invention

The present invention relates to a removing method of a hard mask, and particularly to a removing method of a hard mask applied in a fabricating process of a semiconductor device.

2. Description of the Related Art

In the technology for manufacturing an integrated circuit, a gate structure including an insulating layer with high dielectric constant (high-K) and a metal gate (hereafter called HK/MG for short) has been widely used. Such gate structure can reduce a current leakage, thereby improving the performance of the integrated circuit. Currently, the HK/MG can be selectively fabricated by two processes including a gate-first process and a gate-last process. In the gate-first process, the HK/MG is previously disposed before forming the gate structure. In the gate-last process, after a poly-silicon dummy gate is removed, the metal gate of the HK/MG is filled FIGS. 1(a)-1(b) illustrate a partial process flow of a conventional method for fabricating a partial integrated circuit of two metal-oxide-semiconductor field-effect transistors (MOSFETs) 101, 102. Referring to FIG. 1(a), at first, a number of shallow trench isolations (STI) 109 are defined in a substrate 10. Each of the shallow trench isolations 109 is configured for isolating two neighboring MOSFETs, for example, the two MOSFETs 101, 102, formed on the substrate 10. A gate 11 of each of the MOSFETs 101, 102 covered by a hard mask 16 is formed on a gate insulating layer 12 on the substrate 10. If the gate-first process is applied, the gate 11 is comprised of a poly-silicon gate 110, a work function metal gate 111 and a capping layer 112 (see FIG. 3(a)). If the gate-last process is applied, the gate 11 is comprised of a poly-silicon dummy gate 113 and a barrier metal 114 (see FIG. 3(b)). The gate 11 is surrounded by a spacer 13. The gate insulating layer 12 can be a multiplayer structure as shown in FIG. 1(a), which includes a silicon oxide layer 120 and a high-K insulating layer 121. The spacer 13 also can be a multilayer structure shown in FIG. 1(a), which includes a first spacer 131 and a second spacer 132.

Next, referring to FIG. 1(b), in order to achieve an electrical connection to the metal gate or remove the poly-silicon dummy gate so as to fill the metal gate to substitute for the poly-silicon dummy gate, the hard mask 16 on the gate 11 have to be etched back so as to expose the gate 11. However, the hard mask 16 and the shallow trench isolation 109 usually have an identical material, for example, silicon oxide. During etching back the hard mask 16 by a wet etching process, a top portion of the shallow trench isolation 109 is simultaneously etched to form a recess 108. The formation of the recess 108 has disadvantages as follows. The recess 108 causes a thickness of the shallow trench isolation 109 is reduced, thereby increasing a current leakage. In addition, in the subsequent step of forming a contact etch stop layer (CESL) (not shown), the recess 108 will cause to form a seam between the contact etch stop layer and the shallow trench isolation 109.

Therefore, what is needed is a removing method of a hard mask to overcome the above disadvantages.

BRIEF SUMMARY

The present invention is directed to a removing method of a hard mask so as to prevent a shallow trench isolation from being etched during removing the hard mask.

The present invention provides a removing method of a hard mask. The method includes the following steps. A substrate is provided. At least two MOSFETs are formed on the substrate. An isolating structure is formed in the substrate and located between the at least two MOSFETs. Each of the MOSEFTs includes a gate insulating layer, a gate, a spacer and a hard mask. A protecting structure is formed on the isolating structure and the hard mask is exposed from the protecting structure. The exposed hard mask is removed to expose the gate.

In one embodiment of the present invention, the isolating structure is either a shallow trench isolation or a field oxide isolation. The gate is either a metal gate or a poly-silicon gate. The gate insulating layer includes a silicon oxide layer and a high-K insulating layer. The spacer at least includes a first spacer and a second spacer.

In one embodiment of the present invention, the hard mask and the isolating structure have an identical material.

In one embodiment of the present invention, the hard mask and the isolating structure have an identical material of silicon oxide.

In one embodiment of the present invention, the protecting structure includes a photoresist material or bottom anti-reflective coating (BARC) material.

In one embodiment of the present invention, forming the protecting structure includes the following steps. A photoresist layer is formed to cover the at least two MOSFETs and the isolating structure. The photoresist layer is thinned so as to exposed the hard masks of the at least two MOSFETs.

In one embodiment of the present invention, the hard masks are removed by a wet etching process.

In the method of the present invention, a protecting structure is formed on the isolating structure to protect the isolating structure. Thus, the recess will not be formed in the isolating structure during etching back the hard masks by a wet etching process, thereby reducing a current leakage and avoiding a seam between the contact etch stop layer and the isolating structure.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

These and other features and advantages of the various embodiments disclosed herein will be better understood with respect to the following description and drawings, in which like numbers refer to like parts throughout, and in which:

FIGS. 1(a)-1(b) illustrate a partial process flow of a conventional method for fabricating a MOSFET.

FIGS. 2(a)-2(e) illustrate a partial process flow of a removing method of a hard mask in a fabricating process of MOSFET in accordance with an embodiment of the present invention.

DETAILED DESCRIPTION

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 2E:
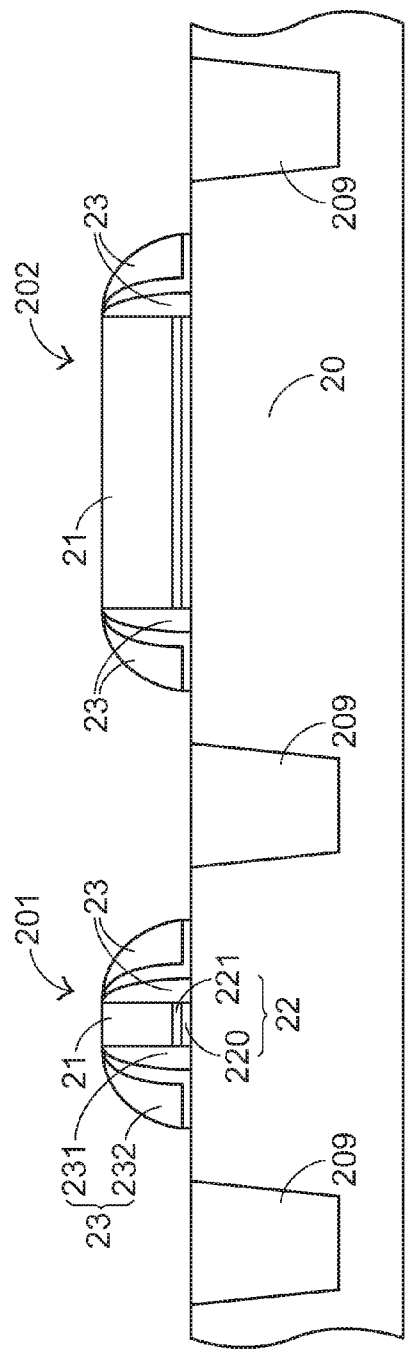
Figure 3A:
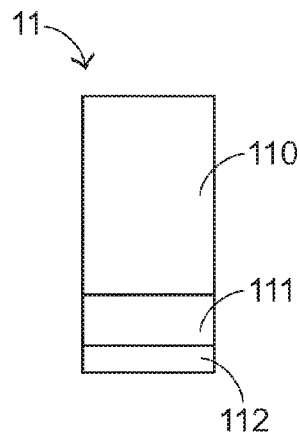
FIG. 3(a) illustrates a schematic view of a gate in a gate-first process.
Figure 3B:
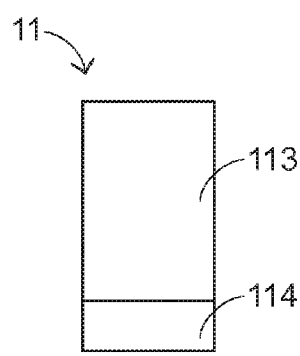
FIG. 3(b) illustrates a schematic view of a gate in a gate-last process.

FIGS. 2(a)-2(e) illustrate a partial process flow of a removing method of a hard mask in a fabricating process of MOSFET in accordance with an embodiment of the present invention. Referring to FIG. 2(a), at first, a number of isolating structures 209 are defined in a substrate 20. Each of the isolating structures 209 is configured for isolating two neighboring MOSFETs 201 and 202 formed on the substrate 20. A gate 21 of each of the MOSFETs 201 and 202 covered by a hard mask 26 is formed on a gate insulating layer 22 on the substrate 20. If the gate-first process is applied, the gate 21 includes a metal gate and a poly-silicon gate (not shown). If the gate-last process is applied, the gate 21 includes a poly-silicon dummy gate. The gate 21 is surrounded by a spacer 23. The gate insulating layer 22 can be a multiplayer structure as shown in FIG. 2(a), which includes a silicon oxide layer 220 and a high-K insulating layer 221. The spacer 23 also can be a multilayer structure shown in FIG. 2(a), which includes a first spacer 231 and a second spacer 232.

Next, referring to FIG. 2(b), a photoresist layer 24 is formed on the substrate 20 to cover the MOSFETs 201, 202 and the isolating structures 209. The photoresist layer 24 can be a material, for example, UV1610, or other suitable photoresist materials, for example, DUO248, SHB, ODL, etc. A thickness of the photoresist layer 24 is about thousands of ($10^{-7}$ mm).

Next, the photoresist layer 24 is directly etched back without a mask. Thus, the photoresist layer 24 is thinned till the hard masks 26 of the MOSFETs 201, 202 are exposed from the photoresist layer 24. An etching time can be controlled here to achieve the above thinning process of the photoresist layer 24. For example, when the photoresist layer 24 is a material of UV1610 and has a thickness of 3300 angstroms, and the MOSFETs 201, 202 each has a thickness of 450 angstroms, the etching time of the photoresist layer 24 is about 132 seconds. Thus, referring to FIG. 2(c), the photoresist material of the photoresist layer 24 on the hard masks 26 can be completely removed to expose the hard masks 26, meanwhile, the photoresist material of the photoresist layer 24 on the isolating structures 209 is still remained, thereby forming a protecting structure 208 to protect the isolating structures 209.

Next, referring to FIG. 2(d), the hard masks 26 on the gates 21 are etched back by a wet etching process or a dry etching process so as to expose the gates 21. During etching back the hard masks 26, the protecting structures 208 on the isolating structures 209 prevent the isolating structures 209 from being etched. For example, when the hard masks 26 include silicon oxide, the etching solution of the wet etching process includes dilute hydrofluoric acid (dHF) or buffered oxide etcher (BOE). It is noted that, a portion of the protecting structure 208 can be etched during etching back the hard masks 26, as shown in FIG. 2(d). Next, referring to FIG. 2(e), the remaining photoresist layer 24 (the remaining protecting structures 208) is stripped. Then, a cleaning process is performed to eliminate the polymer pollution of the aforesaid processes. Afterwards, the subsequent steps, for example, achieving an electrical connection to the metal gate, and removing the poly-silicon dummy gate and filling the metal gate, can be performed.

The isolating structures 209 can be either a shallow trench isolation (STI) or a field oxide isolation. A material of the isolating structures 209 can be silicon oxide. It is noted that the photoresist material of the photoresist layer 24 and silicon oxide have high etching selectivity. Meanwhile, the polymer pollution should be controlled to be acceptable. A material of the hard masks 26 is different from the material of the isolating structures 209. The material of the protecting structures 208 can also different from the material of the hard masks 26. Thus, the removing method of the present invention can be widely applied in a fabricating process of a semiconductor device where the material of the hard masks 26 is identical to or similar to the material of the isolating structures 209. It is only necessary to choose the suitable material of the protecting structures 208. For example, when the material of the hard masks 26 and the isolating structures 209 includes silicon nitride (SiN), the material of protecting structures 208 can include a bottom anti-reflective coating material.

In addition, the photoresist layer 24 can also be etched back by a photolithography process to form the protecting structures 208 except the above method as shown in FIG. 2(b) and FIG. 2(c). A resulting purpose is to form the protecting structures 208 on the isolating structures 209 and to expose the hard masks 26.

In summary, in the method of the present invention, a protecting structure is formed on the isolating structure to protect the isolating structure. Thus, the isolating structures 209 will not be thinned and the recesses will not be formed in the isolating structures 209 during etching back the hard masks 26, thereby reducing a current leakage and avoiding a seam between the contact etch stop layer and the isolating structure.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A removing method of a hard mask, comprising:
   providing a substrate;
   forming at least two MOSFETs on the substrate and an isolating structure between the at least two MOSFETs, each of the two MOSFETs comprising a gate insulating layer, a gate, a spacer and a hard mask on the gate;
   forming either a photoresist layer or a bottom anti-reflective coating layer on the substrate to cover the at least two MOSFETs and the isolating structure;
   etching back either the photoresist layer or the bottom anti-reflective coating layer without a mask till the hard masks of the at least two MOSFETs are exposed, thereby forming a remained photoresist layer or a remained bottom anti-reflective coating layer, wherein the remained photoresist layer or the remained bottom anti-reflective coating layer forms a protecting structure located on and directly contacted with the isolating structure;
   removing the exposed hard masks of the at least two MOSFETs; and removing the protecting structure to expose the isolating structure.

2. The removing method of the hard mask as claimed in claim 1, wherein the isolating structure is either a shallow trench isolation or a field oxide isolation.

3. The removing method of the hard mask as claimed in claim 1, wherein the gate is either a metal gate or a polysilicon gate.

4. The removing method of the hard mask as claimed in claim 1, wherein the gate insulating layer comprises a silicon oxide layer and a high-K insulating layer.

5. The removing method of the hard mask as claimed in claim 1, wherein the spacer at least comprises a first spacer and a second spacer.

6. The removing method of the hard mask as claimed in claim 1, wherein the hard masks and the isolating structure have an identical material.

7. The removing method of the hard mask as claimed in claim 6, wherein the identical material is silicon oxide.

8. The removing method of the hard mask as claimed in claim 1, wherein the hard masks are removed by either a wet etching process or a dry etching process.

* * * * *